United States Patent
Tsuruta et al.

(10) Patent No.: US 9,166,421 B2
(45) Date of Patent: Oct. 20, 2015

(54) SECONDARY BATTERY PACK DISCHARGE SYSTEM

(71) Applicant: Panasonic Corporation, Osaka (JP)

(72) Inventors: Naoki Tsuruta, Shiga (JP); Masaki Ikeda, Shiga (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 429 days.

(21) Appl. No.: 13/681,537

(22) Filed: Nov. 20, 2012

(65) Prior Publication Data

US 2013/0127424 A1    May 23, 2013

(30) Foreign Application Priority Data

Nov. 22, 2011  (JP) ................................. 2011-254571

(51) Int. Cl.
*H01M 10/46* (2006.01)
*H02J 7/00* (2006.01)
*G01R 31/36* (2006.01)

(52) U.S. Cl.
CPC ........... *H02J 7/0031* (2013.01); *G01R 31/3679* (2013.01); *H02J 7/0063* (2013.01); *G01R 31/3648* (2013.01); *H02J 7/0047* (2013.01); *H02J 2007/004* (2013.01); *H02J 2007/0067* (2013.01)

(58) Field of Classification Search
CPC ................... H02J 2007/0039; H02J 2007/004; H02J 7/0031; H02J 7/0026; H02J 7/0021; H02J 7/0047; H02J 7/047
USPC .................. 320/107, 127, 132, 135, 136, 150
See application file for complete search history.

(56) References Cited

U.S. PATENT DOCUMENTS

| 6,495,989 | B1 | 12/2002 | Eguchi |
| 7,923,967 | B2 * | 4/2011 | Hamaguchi et al. .......... 320/134 |
| 8,970,174 | B2 * | 3/2015 | Nakayama et al. .......... 320/134 |
| 2002/0161537 | A1 | 10/2002 | Odaohhara |

(Continued)

FOREIGN PATENT DOCUMENTS

| CN | 101800340 | 8/2010 |
| CN | 102064573 | 5/2011 |

(Continued)

OTHER PUBLICATIONS

Chinese Office Action dated Jun. 4, 2014 issued in a corresponding Chinese application No. 201210480104.8 and the English translation thereof.

(Continued)

*Primary Examiner* — Edward Tso
(74) *Attorney, Agent, or Firm* — Renner, Otto, Boisselle & Sklar, LLP

(57) ABSTRACT

A discharge system includes: a secondary battery pack; a discharge device; and an application software running on a personal computer connected to the discharge device. The application software receives total battery voltage information, temperature information, and over-discharge information of the secondary battery pack through the discharge device, determines deterioration of the secondary battery pack based on the informations, and displays results of the determination. Further, the application software instructs the discharge device to terminate the discharge when the temperature in the pack exceeds a predetermined value and/or an over-discharge is detected.

10 Claims, 3 Drawing Sheets

(56) References Cited

U.S. PATENT DOCUMENTS

| | | |
|---|---|---|
| 2003/0096158 A1 | 5/2003 | Takano et al. |
| 2004/0027093 A1 | 2/2004 | Tashiro et al. |
| 2005/0017686 A1 | 1/2005 | Sakakibara et al. |
| 2006/0119315 A1 | 6/2006 | Sasaki et al. |
| 2008/0224662 A1* | 9/2008 | Hayakawa .............. 320/128 |
| 2010/0194398 A1 | 8/2010 | Kawasumi et al. |
| 2011/0084702 A1 | 4/2011 | Mori |
| 2011/0089905 A1 | 4/2011 | Yano |
| 2011/0109274 A1 | 5/2011 | Minamiura |
| 2012/0007556 A1 | 1/2012 | Matsui et al. |

FOREIGN PATENT DOCUMENTS

| | | |
|---|---|---|
| CN | 102183730 | 9/2011 |
| JP | H10-27630 | 1/1998 |
| JP | 2001-057246 | 2/2001 |
| JP | 2002-320341 | 10/2002 |
| JP | 2002-330547 | 11/2002 |
| JP | 2003-319503 | 11/2003 |
| JP | 2005-043059 | 2/2005 |
| JP | 2006-164547 | 6/2006 |
| JP | 2007-053899 | 3/2007 |
| JP | 2010-166752 | 7/2010 |
| KR | 10-2011-0041994 | 4/2011 |
| KR | 10-2011-0077194 | 7/2011 |

OTHER PUBLICATIONS

Korean Office Action in corresponding Korean Application No. 10-2012-0132937 dated Dec. 5, 2013.
Japanese Office Action dated May 12, 2015 issued in corresponding Japanese application No. 2011-254571 and English summary thereof.

* cited by examiner

SECONDARY BATTERY PACK DISCHARGE SYSTEM

FIELD OF THE INVENTION

The present invention relates to a discharge system for discharging a secondary battery.

BACKGROUND OF THE INVENTION

There is disclosed a discharge system which performs the discharge of a secondary battery to diagnose the life span of the secondary battery (see, e.g., Japanese Patent Application Publication No. 2005-43059). In such a discharge system, there are cases where a temperature of the secondary battery rises when the secondary battery is discharged, or where an over-discharge occurs in one of cells if there is a voltage difference between the cells in the secondary battery including two or more cells connected in series. This requests a measure in the aspect of safety and life span of the secondary battery.

Further, the conventional discharge system can be applied only to existing secondary batteries. Therefore, even if a secondary battery with, e.g., a different total battery voltage is newly provided, the conventional discharge system cannot be applied to the new secondary battery.

SUMMARY OF THE INVENTION

In view of the above, the present invention provides a discharge system having high safety at the time of discharge of a secondary battery and sufficient extensibility to various types of secondary batteries.

In accordance with an aspect of the present invention, there is provided a discharge system, for discharging a secondary battery pack having terminals for outputting signals, the secondary battery pack including secondary cells, a temperature sensor for measuring a temperature in the pack, and an over-discharge detection circuit for detecting an over-discharge of the secondary cells, the discharge system including: a discharge device, connected to the secondary battery pack through the terminals, for controlling discharge of the secondary battery pack; and an application software running on an apparatus connected to the discharge device, wherein the discharge device includes a discharge circuit which controls the secondary cells to discharge, a current detection circuit which detects a discharge current, and a discharge control circuit which controls an operation of the discharge circuit. Further, the application software receives total battery voltage information, temperature information, and over-discharge information of the secondary battery pack through the discharge device, determines deterioration of the secondary battery pack based on the informations, and displays results of the determination. Furthermore, the application software instructs the discharge device to terminate the discharge performed by the discharge circuit thereof when the temperature in the pack exceeds a predetermined value and/or an over-discharge is detected.

With the configuration according to the present invention, a temperature of each of the secondary cells is prevented from excessively increasing, and the voltage thereof is individually monitored. Accordingly, the system can be protected by detecting the over-discharge caused by a deviation in the voltage. Further, the discharge device is connected to the computer, and the determination of the battery life span is performed by running the application software on the computer. Accordingly, even if a new battery with a different capacity is provided, the life span of the new battery can be determined by simply updating the application software.

In the discharge system, when the discharge device is not instructed to terminate the discharge performed by the discharge circuit from the application software during a predetermined period of time after the temperature in the pack exceeds the predetermined value and/or the over-discharge is detected, the discharge device may independently terminate the discharge of the secondary battery pack.

With the above configuration, the discharge is terminated according to states of the secondary battery obtained through a temperature detection terminal or an over-discharge detection terminal. Thus, when the secondary battery increases to a high temperature, or when the over-discharge occurs, it is possible to prevent deterioration of the battery life span while ensuring the safety. In addition, the determination of the battery life span is performed by the application software running on the computer. Therefore, even if a new battery with a different capacity is installed, the life span of the new secondary battery can be determined simply by updating the application software on the computer. Thus, there are beneficial effects in terms of extensibility.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, the present invention will be described in detail based on an exemplary embodiment.

Figure 1:
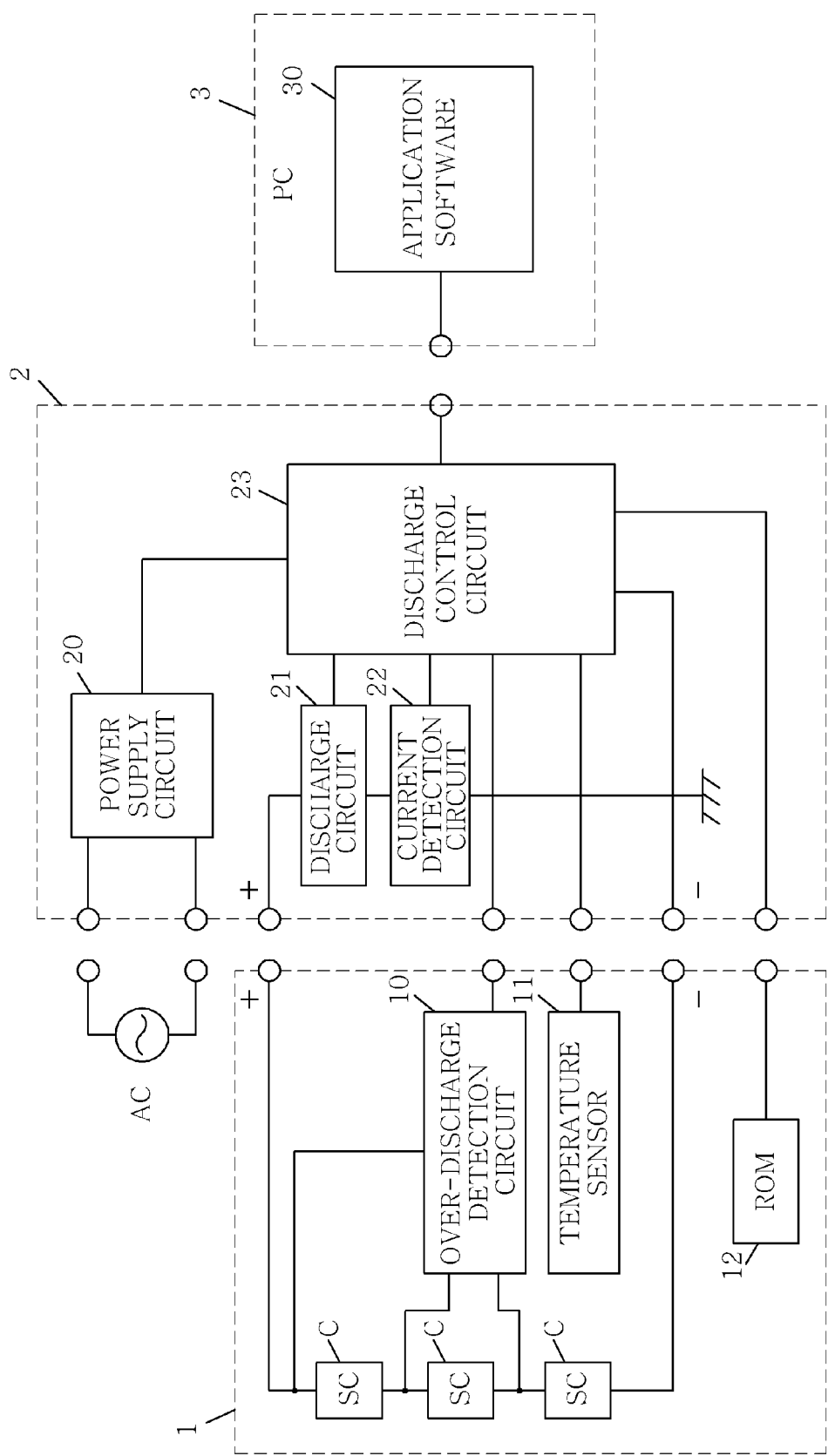
FIG. 1 is a block diagram schematically showing a discharge system in accordance with an embodiment of the present invention.

In FIG. 1, reference numeral 1 denotes a secondary battery pack including a plurality of lithium ion-based secondary cells (SCs) C connected in series (or in parallel). The secondary battery pack 1 also includes a temperature sensor (e.g., thermistor) 11 for measuring temperature in the pack, and an over-discharge detection circuit 10. The over-discharge detection circuit 10 monitors a voltage of each of the secondary cells C and outputs an over-discharge signal when the voltage of one of the secondary cells C is less than a predetermined value.

The secondary battery pack 1 further includes a memory element (ROM) 12 which stores information about the rated voltage and the rated capacity of the secondary battery pack 1. Further, the secondary battery pack 1 includes a readout terminal of the memory element 12, and signal output terminals of the over-discharge detection circuit 10 and the temperature sensor 11 in addition to an output terminal of the secondary cells C.

In FIG. 1, reference numeral 2 denotes a discharge device. The discharge device 2 includes a power supply circuit 20 which rectifies and smoothes an AC voltage from a commercial power source (AC) to converts it into a DC voltage, and then steps down the DC voltage by using a transformer and a switching element, to output a constant voltage. The discharge device 2 further includes a discharge circuit 21 which is connected to the output terminal of the secondary cells C to perform the discharge of the secondary cells C; a current detection circuit 22 which measures a discharge current at the time of discharge through the discharge circuit 21; and a discharge control circuit 23 which performs start, stop and termination of the discharge, and adjusts the discharge current to a target current value by controlling the discharge circuit 21. Furthermore, the discharge control circuit 23 receives the discharge current value measured by the current detection circuit 22 or the signals from the over-discharge detection circuit 10 and the temperature sensor 11 of the secondary battery pack 1 connected thereto, and reads information from the memory element 12.

The discharge control circuit 23 of the discharge device 2 includes a communications unit which communicates with a personal computer (hereinafter referred to as PC) 3 on which an application software 30 can run. The communications unit outputs total battery voltage information, temperature information, over-discharge information and information about the rated voltage and capacity of the secondary battery pack 1 to the PC 3, and receives information on the target current value and the start, stop and termination of the discharge from the PC 3. The communications unit is connected to the PC 3 via a serial interface such as RS232C and USB.

The PC 3 operates the application software 30 to determine the life span of the secondary battery pack. The application software 30 determines the life span of the secondary battery pack based on the total battery voltage information, the temperature information, the over-discharge information and the rated voltage and capacity information of the secondary battery pack 1 obtained through the discharge control circuit 23. Further, the PC 3 controls the operation of the discharge circuit 21 via the discharge control circuit 23.

When the power supply circuit 20 of the discharge device 2 is connected to the commercial power source AC, when the application software 30 is started up in the PC 3 connected to the discharge device 2, and when the secondary battery pack 1 is installed at the discharge device 2, the rated voltage and capacity information of the installed secondary battery pack 1 is transmitted to the PC 3 through the discharge device 2.

The application software 30 on the PC 3 sends a target current setting information and a discharge start instruction to the discharge device 2 based on the obtained rated voltage and capacity information. When the discharge control circuit 23 of the discharge device 2 receives the information, it supplies a power to the circuit of the secondary battery pack 1 and controls the discharge circuit 21 to start the discharge.

Figure 2:
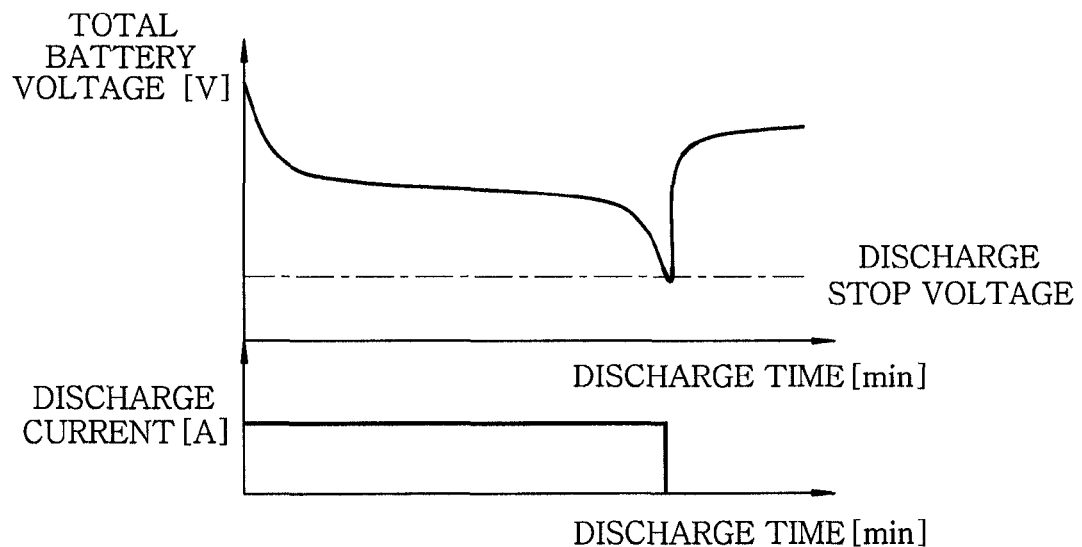
FIG. 2 illustrates a discharge graph in a normal state of the discharge system shown in FIG. 1.

During the discharge, the discharge device 2 transmits the total battery voltage information, the temperature information, and the over-discharge information obtained from the secondary battery pack 1 to the PC 3. As shown in FIG. 2, when the total battery voltage reaches a predetermined value, e.g., a discharge stop voltage, the application software 30 on the PC 3 sends a discharge stop command to the discharge device 2, thereby stopping the discharge. Further, the application software 30 determines deterioration of the secondary battery pack based on the total battery voltage information, the temperature information, and the over-discharge information of the secondary battery pack received through the discharge device 2, and displays results of the determination on, e.g., a monitor of the PC 3.

Figure 3:
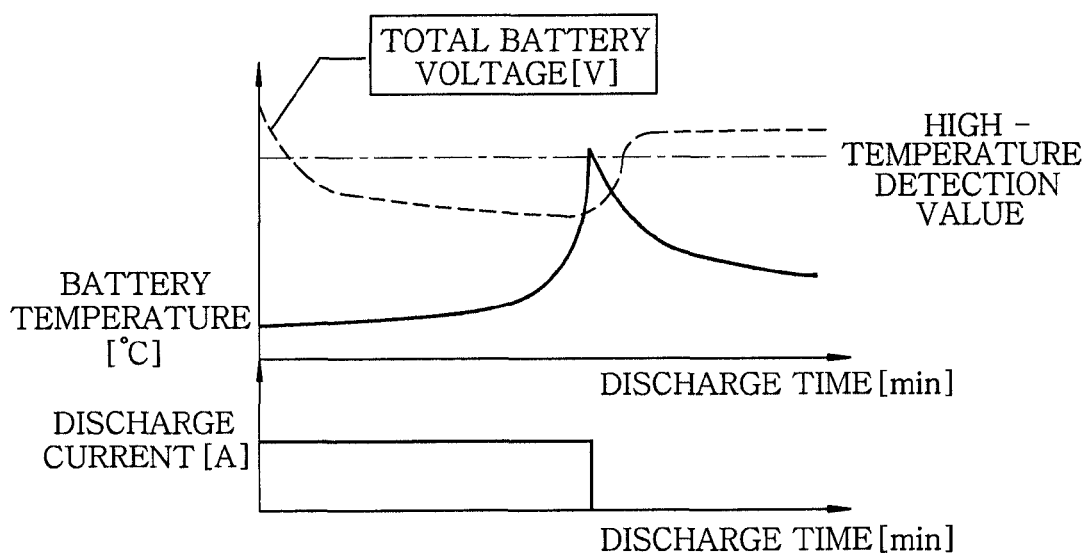
FIG. 3 depicts a discharge graph when the discharge is halted due to a high temperature of the battery in the discharge system shown in FIG. 1.
Figure 4:
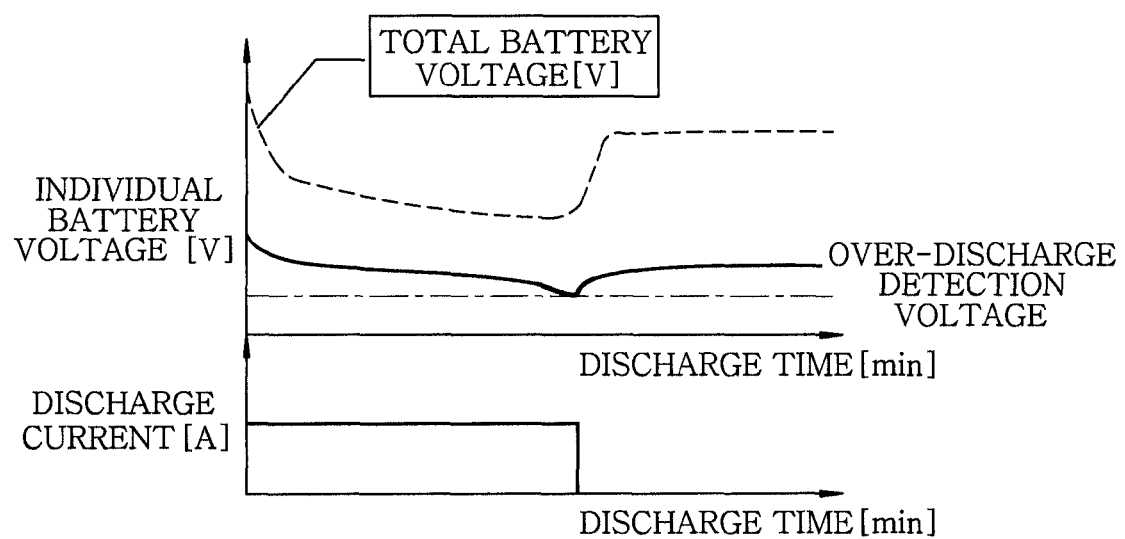
FIG. 4 represents a discharge graph when the discharge is halted due to an over-discharge in the discharge system shown in FIG. 1.

Next, an operation of the discharge system will be described with reference to FIGS. 3 and 4. When temperature detected by the temperature sensor 11 in the secondary battery pack 1 exceeds a predetermined temperature, e.g., a high-temperature detection value, or when the over-discharge is detected by the over-discharge detection circuit 10, the discharge control circuit 23 of the discharge device 2 transmits information related thereto to the PC 3. When the application software 30 on the PC 3 receives the information through the discharge control circuit 23, it sends a discharge stop command to the discharge device 2, thereby stopping the discharging. Further, the application software 30 displays reasons leading to the termination of the discharge, e.g., an excessive increase in temperature of the battery or over-discharge, on the monitor of the PC 3.

In the above embodiment, the discharge control circuit 23 controls the discharge circuit 21 to terminate the discharging in response to the instructions from the PC 3 when the secondary cells C have a high temperature or are over-discharged. However, if there are no instructions to terminate the discharge from the PC 3 even though a predetermined time has elapsed since the high temperature or over-discharge was detected, the discharge control circuit independently may control the discharge circuit 21 to terminate the discharging. Therefore, it is possible to reliably prevent deterioration of the battery life span while ensuring high safety.

In addition, the rating information of the secondary battery pack 1 may be provided in the PC 3. That is, rating information corresponding to various types of the secondary battery packs may be stored in advance on the PC 3, the application software 30 of the PC 3 may select the rating information corresponding to the type of the secondary battery pack installed at the discharge device 2.

While the invention has been shown and described with respect to the embodiments, it will be understood by those skilled in the art that various changes and modification may be made without departing from the scope of the invention as defined in the following claims.

What is claimed is:

1. A discharge system for discharging a secondary battery pack having terminals for outputting signals, the secondary battery pack including secondary cells, a temperature sensor for measuring a temperature in the pack, and an over-discharge detection circuit for detecting an over-discharge of the secondary cells, the discharge system comprising:
    a discharge device, connected to the secondary battery pack through the terminals, for controlling discharge of the secondary battery pack; and
    an application software running on a computer connected to the discharge device,
    wherein the discharge device includes a discharge circuit which controls the secondary cells to discharge, a current detection circuit which detects a discharge current, and a discharge control circuit which controls an operation of the discharge circuit,
    wherein the application software receives total battery voltage information, temperature information, and over-discharge information of the secondary battery pack through the discharge device, determines deterioration of the secondary battery pack based on the informations, and displays results of the determination, and
    wherein the application software instructs the discharge device to terminate the discharge performed by the discharge circuit thereof when the temperature in the pack exceeds a predetermined value and/or an over-discharge is detected.

2. The discharge system of claim 1, wherein, when the discharge device is not instructed to terminate the discharge performed by the discharge circuit from the application software during a predetermined period of time after the temperature in the pack exceeds the predetermined value and/or the over-discharge is detected, the discharge device independently terminates the discharge of the secondary battery pack.

3. The discharge system of claim 1, wherein the secondary battery pack further includes a memory in which rating information including a rated voltage and a rated capacity thereof is stored, and
wherein the application software receives the rating information of the secondary battery pack through the discharge device, and determines a life span of the secondary battery pack based on the received rating information.

4. The discharge system of claim 2, wherein the secondary battery pack further includes a memory in which rating information including a rated voltage and a rated capacity thereof is stored, and
wherein the application software receives the rating information of the secondary battery pack through the discharge device, and determines a life span of the secondary battery pack based on the received rating information.

5. The discharge system of claim 1, wherein the computer is provided with rating information sets corresponding to secondary battery packs of various types, each rating information set including a rated voltage and a rated capacity of one of the secondary battery packs of the various types, and
wherein the application software selects the rating information set corresponding to the secondary battery pack among the rating information sets, and determines a life span of the secondary battery pack based on the selected rating information set.

6. The discharge system of claim 2, wherein the computer is provided with rating information sets corresponding to secondary battery packs of various types, each rating information set including a rated voltage and a rated capacity of one of the secondary battery packs of the various types, and
wherein the application software selects the rating information set corresponding to the secondary battery pack among the rating information sets, and determines a life span of the secondary battery pack based on the selected rating information set.

7. The discharge system of claim 3, wherein the application software sends a discharge start instruction and target current set information to the discharge device based on the rating information.

8. The discharge system of claim 4, wherein the application software sends a discharge start instruction and target current set information to the discharge device based on the rating information.

9. The discharge system of claim 5, wherein the application software sends a discharge start instruction and target current set information to the discharge device based on the rating information.

10. The discharge system of claim 6, wherein the application software sends a discharge start instruction and target current set information to the discharge device based on the rating information.

* * * * *